United States Patent [19]

Reuss, Jr.

[11] Patent Number: 4,477,781

[45] Date of Patent: Oct. 16, 1984

[54] COMBINED MICROWAVE PARALLEL AMPLIFIER- RF ATTENUATOR/MODULATOR

[75] Inventor: Max L. Reuss, Jr., New Carrollton, Md.

[73] Assignee: The United States of America as represented by the Secretary of the Navy, Washington, D.C.

[21] Appl. No.: 467,430

[22] Filed: Feb. 17, 1983

[51] Int. Cl.³ .............................................. H03F 3/60
[52] U.S. Cl. ..................................... 330/286; 330/54; 330/124 R
[58] Field of Search ................. 330/53, 54, 56, 124 R, 330/286, 287

[56] References Cited

U.S. PATENT DOCUMENTS

| 3,202,928 | 8/1965 | Prior | 330/124 R |
| 3,423,688 | 1/1969 | Seidel | 330/54 |
| 3,480,885 | 11/1969 | Schrank | 330/124 R |
| 4,092,616 | 5/1978 | Osterwalder | 330/53 |

Primary Examiner—James B. Mullins
Assistant Examiner—G. Wan
Attorney, Agent, or Firm—Robert F. Beers; William T. Ellis; Charles E. Krueger

[57] ABSTRACT

A parallel channel microwave amplifier comprising a plurality of amplification channels interconnecting a power-dividing matrix and a power-combining matrix. Each amplification channel includes a phase shifter, an attenuator and a power amplifier connected in series. The device functions as a combination of amplifier and an r.f. attenuator/modulator.

17 Claims, 4 Drawing Figures

COMBINED MICROWAVE PARALLEL AMPLIFIER- RF ATTENUATOR/MODULATOR

BACKGROUND OF THE INVENTION

The present invention relates generally to microwave amplifiers and more particularly to a microwave amplifier combining two or more tubes in parallel.

There are many applications in radar, communications and electronic warfare that require high power microwave signals whose amplitude can be precisely varied over a given range of values. Due to the nonlinear characteristics of available high power amplifiers (tubes), precise control of the output signal amplitude by varying the amplitude of the low power input signal is often not feasible over the frequency range of operation required. An alternative approach that has been utilized is to operate the high power amplifier at/near saturation and attenuate/modulate the output signal by use of a high power electronically controllable attenuator. Such an attenuator/modulator dissipates power (has loss) even in its lowest attenuation state, thus the efficiency of the combination of amplifier and attenuator/modulator is less than that of the amplifier alone.

Existing parallel tube amplifiers have also been utilized as combination amplifier switches; however such usage has been limited by poor switch isolation (power delivered to undesired output ports).

OBJECTS OF THE INVENTION

Accordingly, it is an object of the invention to provide an efficient combination parallel microwave amplifier attenuator/modulator.

It is a further object of the invention to provide a parallel microwave amplifier with no power exiting at undesired output ports.

It is still a further object of the invention to eliminate the need for a high power attenuator/modulator.

SUMMARY OF THE INVENTION

The above and other objects are achieved in the present invention which comprises two or more amplification channels connected in parallel by hybrid techniques. Each amplification channel includes an electronic phase shifter, an electronic attenuator and a power amplifier. The phase and amplitude of a signal in a given amplification channel are controlled by adjusting the channel phase shifter and attenuator settings. These adjustments reduce power at undesired output ports and also allow output power to be transferred between various output ports thereby attenuating output power at any desired output port.

Since the phase-shifter and attenuator are positioned before the power amplifier, inexpensive low-power components are utilized for the attenuation/modulation function thus eliminating the need for a high power attenuator/modulator.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The present invention is a new and improved microwave amplifier utilizing two or more amplification channels connected in parallel by hybrid techniques. Each amplification channel includes a phase shifter, an attenuator and a power amplifier connected in series. The invention provides improved control of output power and increased efficiency over existing microwave amplifiers followed by r.f. attenuators.

Figure 1:
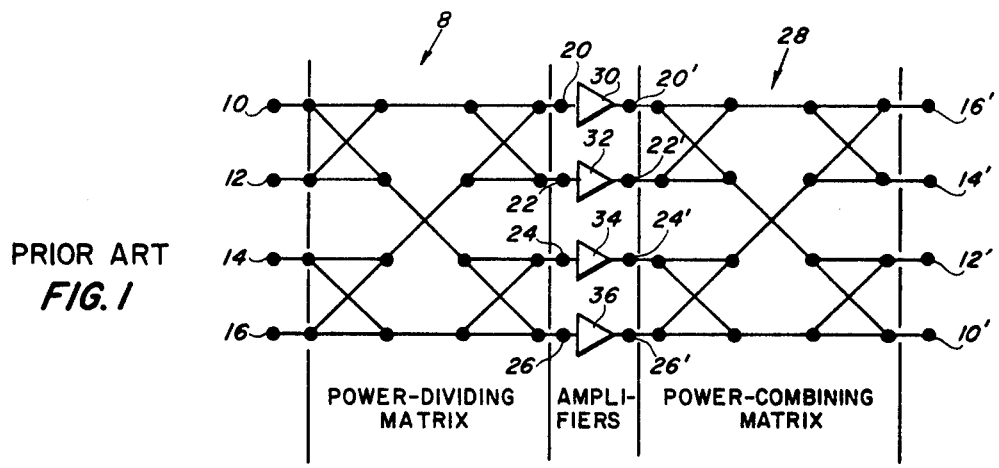
FIG. 1 is a schematic diagram of a prior art parallel amplifier.

Referring now to the drawings, wherein like reference numerals designate identical or corresponding parts throughout the several views, and more particularly to FIG. 1 thereof, a typical prior art parallel amplifier is depicted. A powerdividing matrix 8 with four inputs 10, 12, 14, 16 for providing four intermediate output signals at four intermediate output ports 20, 22, 24, 26, is interconnected with a powercombining matrix 28 with four intermediate input ports 20', 22', 24', 26' and with four outputs 10', 12', 14', 16'. The matrices 8 and 28 are connected through four amplifiers 30, 32, 34, 36.

Figure 2:
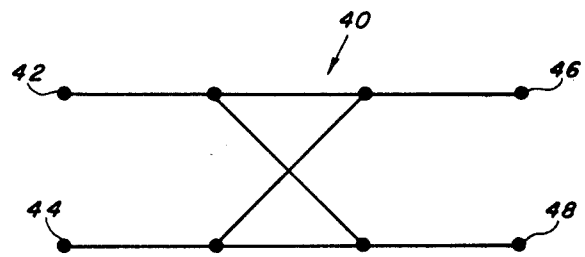
FIG. 2 is a schematic diagram of a 3dB hybrid.

Each matrix includes four interconnected 3dB hybrids, which are illustrated in FIG. 2, a schematic diagram of a 3dB hybrid 40. Referring now to FIG. 2, the hybrid 40 includes a first pair of ports 42, 44 and a second pair of ports 46, 48.

An input signal of amplitude 1, applied to either of the first pair of ports will cause an output signal of amplitude $1/\sqrt{2}$ to appear at both of the second pair of ports. There are numerous types of hybrids known in the art, e.g., waveguide magic tees or quadrature waveguide couplers.

Referring back to FIG. 1, note that the power-combining matrix 28 and power-dividing matrix 8 are symmetric and thus the output ports of the power divider matrix 8 may be directly connected to the input ports of the power combining matrix 28. This arrangement of matrices is denoted the back-to-back configuration.

The particular embodiment of the matrices is not unique and alternative embodiments would be obvious to one skilled in the art.

A description of the operation of the parallel microwave amplifier depicted in FIG. 1 follows. First, assume that the amplifiers are ideal amplifiers with identical gains, T, and phase shifts, $\alpha$. Because of the symmetry of the system, a signal applied to a given input port will appear at a diagonally opposite output port. For example, an input signal applied to the top input port 10 will appear at the bottom output port 10'. Since the gain of each ampliflier is T, then a unit signal applied at the input port will have amplitude T at the output port.

Unfortunately, in any real system the gain, T, and phase shift, $\alpha$, of the different amplifiers will not be equal. Note that $\alpha$ is an inherent parameter of the amplifier for a given T and is not controllable. Thus, if the gain, T, of the amplifiers is equalized the phase shift, $\alpha$, of the amplifiers will generally not be equalized. These phase shifts introduced between the intermediate output ports and intermediate input ports destroys the symmetry of the back-to-back configuration and causes power to exit from undesired output ports.

Figure 3:
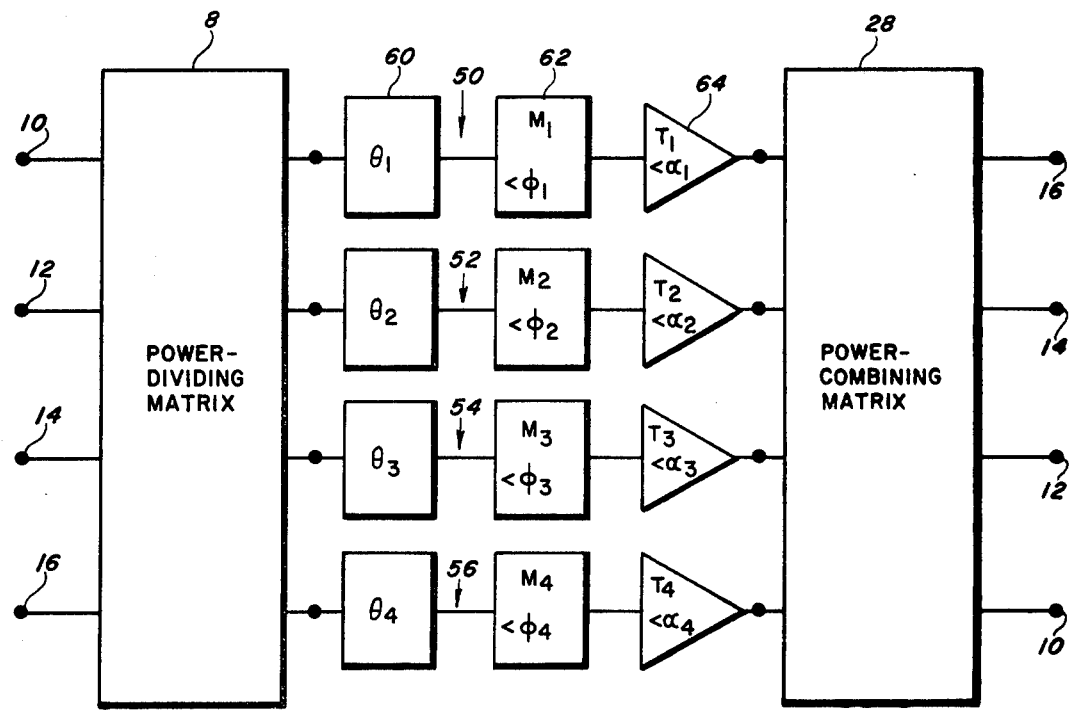
FIG. 3 is a block diagram of an embodiment of the present invention.

A block diagram of the present invention is depicted in FIG. 3. Referring now to FIG. 3, a power dividing matrix 8 is connected to a power-combining matrix 28 by four amplification channels 50, 52, 54, 56. Each amplification channel includes an electronic phase-shifter 60, an attenuator 62, and an amplifier 64. Each of these components causes the phase of the signal to change, where $\theta_i$ is the phase shift of the electronic phase shifter 60, $\phi_i$ is the phase shift of the electronic attenuator 62, and $\alpha_i$ is phase shift of the power amplifier 64. However, only $\theta_i$ is independently controllable since $\alpha_i$ and $\phi_i$ vary in a noncontrollable manner as $T_i$ and $M_i$ are adjusted to desired values.

Electronic phase shifters and attenuators are well-known in the art. By way of example, the phase shifters may be Triangle Microwave DP-51 (2–4GHz) or DP-58 (4–8GHz) and the attenuators Triangle Microwave BG-34 (2–8GHz) or BG-35 (4–8GHz). The amplifiers may be travelling wave tubes (TWT) or solid state amplifiers.

The phase shift, $\beta_i$, of an amplification channel may be adjusted by varying the phase, $\theta_i$ of the phase-shifter 60. Additionally, the gain of a channel is equal to the quantity $M_iT_i$ where $M_i$ is the adjustable attenuation factor of the attenuator, i.e., the ratio of the amplitude of the output signal from the attenuator 62 to the amplitude of the input signal to the attenuator 62, and $T_i$ is the gain of the amplifier 64.

While the effective gain of a channel, $M_iT_i$, may be changed by adjusting $M_i$ and/or $T_i$, in practice the amplifier may be operating at saturation so that $T_i$ is, in fact, not variable. Thus, the gain of an amplification channel is generally controlled by adjusting $M_i$.

The attenuator 62 is placed between the power-dividing matrix 8 and the amplifier 64 so that only low power signals pass therethrough. In general, low-power components are less expensive than high-power components.

In view of the above, it is clear by symmetry that if the amplifier is adjusted so that $\beta$ and MT are the same for each amplification channel, a signal applied to any input port will create an output signal only at the diagonally opposite output port thereby eliminating unwanted output signals.

Alternatively, the present invention may be utilized to attenuate the output power at a given port. This application will described more fully below.

Figure 4:
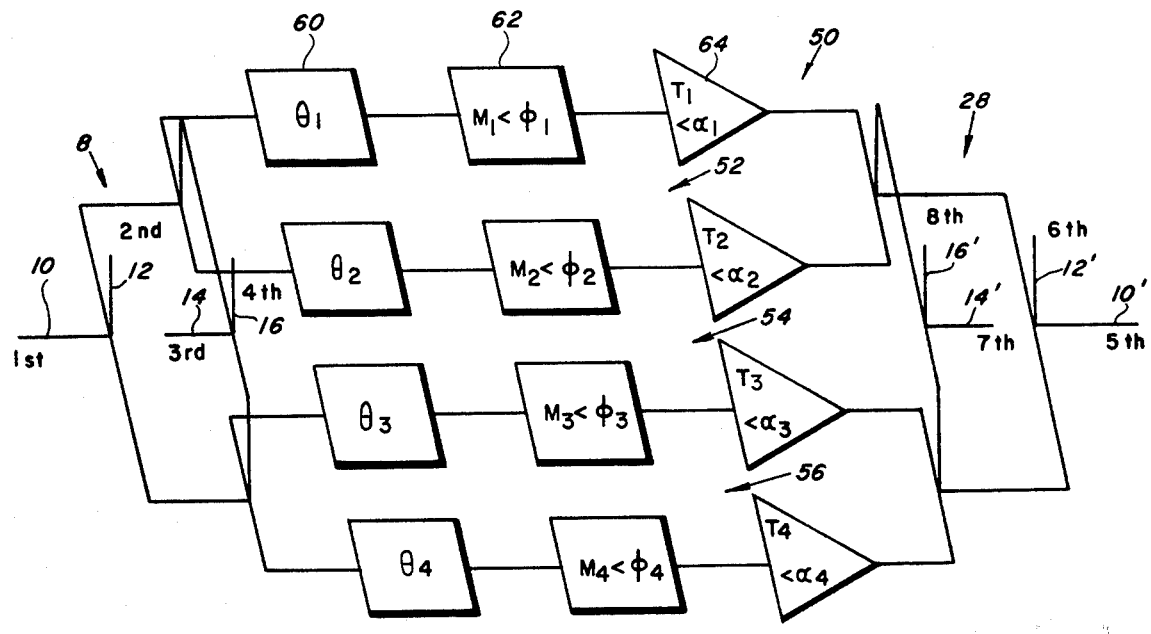
FIG. 4 is a schematic diagram of an embodiment of the present invention utilizing waveguides and magic tees as power-dividing and power-combining matrices.

FIG. 4 is a schematic diagram of a parallel amplifier utilizing waveguides and magic tees as power-dividing and power-combining matrices 8 and 28. Referring now to FIG. 4, a power-dividing matrix 8 and a power-combining matrix 28 are each formed from four interconnected magic tees. The power-dividing matrix 8 has a first, second, third and fourth input ports 10, 12, 14, 16 and the power-combining matrix has a fifth, sixth, seventh and eighth output ports 10', 12', 14', 16'.

Each amplification channel 50, 52, 54, 56 changes the phase of a signal by $\beta_i = \theta_i + \phi_i + \alpha_i$ and changes its magnitude by the factor $M_iT_i$.

For an input signal of unit amplitude at the ith input port, the amplitude of the signal at the jth output port is $A_{ij}$ where i=1,2,3,4, and k=5,6,7,8. From inspection of symmetry FIG. 4 the following relations are established:

$$A_{15} = A_{37} = \tfrac{1}{4}(M_1T_1e^{i\beta_1} + M_2T_2e^{i\beta_2} + M_3T_3e^{i\beta_3} + M_4T_4e^{i\beta_4}) \quad (1)$$

and $$A_{16} = A_{38} = \tfrac{1}{4}(M_1T_1e^{i\beta_1} + M_2T_2e^{i\beta_2} - M_3T_3e^{i\beta_3} - M_4T_4e^{i\beta_4}) \quad (2)$$

If all $\beta_i$ and $M_iT_i$ are equal, i.e., $\beta_i = \beta$ and $M_iT_i = MT$ then $A_{15} = MTe^{i\beta}$. Since $MTe^{i\beta}$ represents the total signal power $A_{1K} = 0$ for k=6,7, 8. Therefore, as described above, an input signal at the first input port will generate an output signal at only the sixth port.

If the $\beta_i$s are not equal then:

$$A_{15} = \tfrac{1}{2} MTe^{i\left(\frac{\beta_5 + \beta_6}{2}\right)} \left[ \left( \cos\left(\frac{\beta_1 - \beta_2}{2}\right) + \cos\left(\frac{\beta_3 - \beta_4}{2}\right) \right) \cos\left(\frac{\beta_5 - \beta_6}{2}\right) + i\left( \cos\left(\frac{\beta_1 - \beta_2}{2}\right) - \cos\left(\frac{\beta_3 - \beta_4}{2}\right) \right) \sin\left(\frac{\beta_5 - \beta_6}{2}\right) \right] \quad (3)$$

$$A_{16} = \tfrac{i}{2} MTe^{i\left(\frac{\beta_5 + \beta_6}{2}\right)} \left[ \left( \sin\left(\frac{\beta_1 - \beta_2}{2}\right) + \sin\left(\frac{\beta_3 - \beta_4}{2}\right) \right) \cos\left(\frac{\beta_5 - \beta_6}{2}\right) + i\left( \sin\left(\frac{\beta_1 - \beta_2}{2}\right) - \sin\left(\frac{\beta_3 - \beta_4}{2}\right) \right) \sin\left(\frac{\beta_5 - \beta_6}{2}\right) \right]$$

where
$\beta_5 = (\beta_1 + \beta_2)/2$,
$\beta_6 = (\beta_3 + \beta_4)/2$, and $M_iT_i + MT$.

Thus, the output power at the fifth or sixth port may be controlled by adjusting the phase shifters. Persons skilled in the art apprised of the teachings of the present invention will recognize that control may be achieved by adjusting $\beta_i$ or $M_i$ singularly or in combination.

The use of low power phase shifters and attenuators positioned before the power amplifiers to control output power eliminates the need for expensive high power attenuators positioned at an output ports and should allow (1) faster attenuator operation than with a high power, controllable attenuator and (2) greater efficiency than use of an amplifier followed by a high power attenuator.

The invention is described with four amplification channels. In view of the performance, complexity and cost limitations imposed by existing technology, a four channel amplifier may represent a practical limit on the number of channels. It is understood, however, that the principles of the invention, as set forth in the appended claims, may be practice with any number of amplification channels.

Obviously, numerous (additional) modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A parallel microwave amplifier comprising:

power-dividing matrix means with N input ports and N intermediate output ports where N is an integer greater than 1 for providing N intermediate output signals;

power-combining matrix means with N intermediate input ports and N output ports for accepting N intermediate input signals;

N amplification channels, interconnecting each of said intermediate output ports with a different one of said intermediate input ports, for connecting said power-dividing matrix with said power-combining matrix in a back-to-back configuration, wherein each of said amplification channels includes a phase-shifter, an attenuator, and an amplifier connected in series.

2. The parallel microwave amplifier recited in claim 1 wherein:

said power-dividing and said power-combining matrix means include a like plurality of interconnected hybrid junctions.

3. The parallel microwave amplifier recited in claim 2 wherein:

said hybrid connectors are waveguide magic tees interconnected by waveguides.

4. The parallel microwave amplifier recited in claim 3 wherein:

each of said amplifiers is a travelling wave tube (TWT).

5. The parallel microwave amplifier recited in claim 1 wherein:

each of said attenuators is positioned between an intermediate output port of said power dividing matrix means and an amplifier.

6. The parallel microwave amplifier recited in claim 5 wherein:

said amplifier and said attenuator in each amplification channel means are adjusted so that $$M_iT_i + C; i = 1, 2, \ldots, N$$

where $M_i$ is the attenuation factor of an attenuator, $T_i$ is gain of an amplifier and C is a constant.

7. A parallel microwave amplifier comprising:

a power-dividing matrix with N input ports and N intermediate output ports for providing N intermediate output signals where N is an even integer greater than or equal to 2, said power-dividing matrix including N/2 waveguide magic tees;

a power-combining matrix with N intermediate input ports and N output ports for accepting N intermediate input signals, said power combining matrix including N/2 waveguide magic tees; and N amplification channels, interconnecting each of said intermediate output ports with one of said intermediate input ports, for connecting said power-dividing matrix with said power combining matrix, wherein each amplification channel includes a phase-shifter, an attenuator, and an amplifier connected in series.

8. The parallel microwave amplifier recited in claim 7 wherein:

each of said amplifiers is a TWT.

9. The parallel microwave amplifier recited in claim 7 wherein:

each of said attenutors is positioned between an intermediate output port and an amplifier.

10. The parallel microwave amplifier recited in claim 9 wherein:

said amplifier and said attenuator in each amplification channel means are adjusted so that $$M_iT_i = C, i = 1, 2, \ldots, N$$

where $M_i$ is the attenuation factor of an attenuator, $T_i$ is the gain of an amplifier and C is a constant.

11. A parallel microwave amplifier comprising:

a pair of input waveguide magic tees with four input ports, said input magic tees interconnected to form a power dividing matrix with four intermediate output ports;

a pair of output waveguide magic tees with four output ports, said output magic tees interconnected to form a power dividing matrix with four intermediate input ports; and four amplification channels, each channel interconnecting one output port with an intermediate input port, and with each of said amplification channels including a phase shifter, an attenuator and an amplifier connected in series.

12. The parallel microwave amplifier recited in claim 11 wherein:

each of said amplifiers is a TWT.

13. The parallel microwave amplifier recited in claim 12 wherein:

said phase shifter in each amplification channel is directly connected to an intermediate output port, said amplifier in each amplification channel is directly connected to an input port and said attenuator in each amplification channel is positioned between said phase shifter and said amplifier.

14. The parallel microwave amplifier recited in claim 13 wherein:

said amplifier and said attenuator in each amplification channel is adjusted so that $$M_iT_i = C \; i = 1, 2, 3, \ldots, N$$

where $M_i$ is the attenuation factor of an attenuator, $T_i$ is the gain of an amplifier and C is a constant.

15. A method for controlling the amplitude of a microwave signal at an output port of a power-combining matrix interconnected with a power-dividing matrix by a plurality of amplification channels, where each amplification channel includes a phase shifter, an attenuator and an amplifier, said method comprising the steps of:

setting the gain $T_i$ of each of said amplifiers to a predetermined value, adjusting the attenuation factor of $M_i$ each attenuator so that the product $M_iT_i$ in each of said amplification channel is equal to a predetermined value; and adjusting the phase, $\theta_i$ of each phase shifter so that the phase shift, $\beta_i$, in each amplification channel is equal to a predetermined value.

16. The method recited in claim 15 wherein:

said step of adjusting said attenuators includes the step of equalizing the value of the product $M_iT_i$ in each amplification channel.

17. The method recited in claim 16 wherein:

said step of adjusting said phase shifters includes the step of equalizing the value of $\beta_i$ in each amplification channel.

* * * * *